(12) United States Patent
Sreenivasan et al.

(10) Patent No.: US 7,244,386 B2
(45) Date of Patent: *Jul. 17, 2007

(54) METHOD OF COMPENSATING FOR A VOLUMETRIC SHRINKAGE OF A MATERIAL DISPOSED UPON A SUBSTRATE TO FORM A SUBSTANTIALLY PLANAR STRUCTURE THEREFROM

(75) Inventors: Sidlgata V. Sreenivasan, Austin, TX (US); Frank Y. Xu, Round Rock, TX (US)

(73) Assignee: Molecular Imprints, Inc., Austin, TX (US)

( * ) Notice: Subject to any disclaimer, the term of this patent is extended or adjusted under 35 U.S.C. 154(b) by 48 days.

This patent is subject to a terminal disclaimer.

(21) Appl. No.: 10/951,014

(22) Filed: Sep. 27, 2004

(65) Prior Publication Data

US 2006/0068120 A1 Mar. 30, 2006

(51) Int. Cl.
*B29C 35/08* (2006.01)
*B29C 59/16* (2006.01)
*B29C 41/22* (2006.01)
*C08J 7/18* (2006.01)
*C08F 2/46* (2006.01)
*C08F 2/48* (2006.01)
*B29C 33/06* (2006.01)
*B29C 59/02* (2006.01)

(52) U.S. Cl. .............. 264/496; 427/495; 427/508; 427/510; 427/512; 264/405; 264/447; 264/479; 264/481

(58) Field of Classification Search ............... None
See application file for complete search history.

(56) References Cited

U.S. PATENT DOCUMENTS 4,022,855 A * 5/1977 Hamblen ............... 264/1.38

(Continued)

FOREIGN PATENT DOCUMENTS

JP 58-129074 8/1983

(Continued)

OTHER PUBLICATIONS

Webster's Ninth New Collegiate Dictionary, Merriam-Webster's Inc.,USA, 1990 (no month), excerpt pp. 53 & 284.*

(Continued)

*Primary Examiner*—Marianne Padgett
(74) *Attorney, Agent, or Firm*—Kelly K. Kordzik; Fish & Richardson P.C.; Michael D. Carter

(57) ABSTRACT

The present invention provides a method of planarizing a substrate with a template spaced-apart from the substrate having a liquid disposed therebetween, the method including: contacting the liquid with the template forming a first shape therein; and impinging radiation upon the liquid causing a reduction in volume of the liquid, with the first shape compensating for the reduction in volume such that upon impinging the actinic radiation upon the liquid, the liquid forms a contoured layer having a substantially planar shape.

17 Claims, 6 Drawing Sheets

U.S. PATENT DOCUMENTS

| | | | |
|---|---|---|---|
| 4,070,116 A | | 1/1978 | Frosch et al. |
| 4,364,971 A | * | 12/1982 | Sack et al. .................. 427/494 |
| 4,512,848 A | | 4/1985 | Deckman et al. |
| 4,521,445 A | * | 6/1985 | Nablo et al. ................ 427/496 |
| 4,552,832 A | | 11/1985 | Blume et al. |
| 4,637,904 A | * | 1/1987 | Rounds ..................... 264/1.38 |
| 4,707,218 A | | 11/1987 | Giammarco et al. |
| 4,731,155 A | | 3/1988 | Napoli et al. |
| 4,737,425 A | | 4/1988 | Lin et al. |
| 4,909,151 A | | 3/1990 | Fukui et al. |
| 4,957,663 A | * | 9/1990 | Zwiers et al. .............. 264/1.38 |
| 4,959,252 A | | 9/1990 | Bonnebat et al. |
| 5,028,361 A | * | 7/1991 | Fujimoto .................... 264/496 |
| 5,028,366 A | | 7/1991 | Harakal et al. |
| 5,124,089 A | * | 6/1992 | Ohkoshi et al. ........... 264/1.38 |
| 5,151,754 A | | 9/1992 | Ishibashi et al. |
| 5,240,550 A | | 8/1993 | Boehnke et al. |
| 5,246,880 A | | 9/1993 | Reele et al. |
| 5,288,436 A | * | 2/1994 | Liu et al. .................... 264/1.38 |
| 5,425,848 A | * | 6/1995 | Haisma et al. ................ 216/48 |
| 5,468,542 A | * | 11/1995 | Crouch ....................... 428/215 |
| 5,480,047 A | | 1/1996 | Tanigawa et al. |
| 5,545,367 A | | 8/1996 | Bae et al. |
| 5,601,641 A | | 2/1997 | Stephens |
| 5,654,238 A | | 8/1997 | Cronin et al. |
| 5,736,424 A | * | 4/1998 | Prybyla et al. ............. 438/780 |
| 5,772,905 A | | 6/1998 | Chou |
| 5,849,209 A | | 12/1998 | Kindt-Larsen et al. |
| 5,849,222 A | | 12/1998 | Jen et al. |
| 5,888,650 A | | 3/1999 | Calhoun et al. |
| 6,046,056 A | | 4/2000 | Parce et al. |
| 6,048,799 A | | 4/2000 | Prybyla |
| 6,074,827 A | | 6/2000 | Nelson et al. |
| 6,218,316 B1 | | 4/2001 | Marsh |
| 6,309,580 B1 | | 10/2001 | Chou |
| 6,326,627 B1 | | 12/2001 | Putvinski et al. |
| 6,334,960 B1 | | 1/2002 | Willson et al. |
| 6,391,217 B2 | | 5/2002 | Schaffer et al. |
| 6,482,742 B1 | | 11/2002 | Chou |
| 6,503,829 B2 | | 1/2003 | Kim et al. |
| 6,517,977 B2 | | 2/2003 | Resnick et al. |
| 6,517,995 B1 | | 2/2003 | Jacobenson et al. |
| 6,518,189 B1 | | 2/2003 | Chou |
| 6,580,172 B2 | | 6/2003 | Mancini et al. |
| 6,646,662 B1 | | 11/2003 | Nebashi et al. |
| 6,696,220 B2 | | 2/2004 | Bailey et al. |
| 6,713,238 B1 | | 3/2004 | Chou et al. |
| 6,719,915 B2 | | 4/2004 | Willson et al. |
| 6,776,094 B1 | | 8/2004 | Whitesides et al. |
| 6,809,356 B2 | | 10/2004 | Chou |
| 6,828,244 B2 | | 12/2004 | Chou |
| 6,870,301 B2 | | 3/2005 | Choi et al. |
| 2002/0042027 A1 | | 4/2002 | Chou et al. |
| 2002/0094496 A1 | | 7/2002 | Choi et al. |
| 2002/0132482 A1 | | 9/2002 | Chou |
| 2002/0167117 A1 | | 11/2002 | Chou |
| 2002/0177319 A1 | | 11/2002 | Chou |
| 2003/0034329 A1 | | 2/2003 | Chou |
| 2003/0080471 A1 | | 5/2003 | Chou |
| 2003/0080472 A1 | | 5/2003 | Chou |
| 2003/0184917 A1 | | 10/2003 | Chang et al. |
| 2003/0197312 A1 | * | 10/2003 | Hougham et al. .......... 264/496 |
| 2004/0007799 A1 | | 1/2004 | Choi et al. |
| 2004/0008334 A1 | | 1/2004 | Sreenivasan et al. |
| 2004/0009673 A1 | | 1/2004 | Sreenivasan et al. |
| 2004/0021254 A1 | | 2/2004 | Sreenivasan et al. |
| 2004/0021866 A1 | | 2/2004 | Watts et al. |
| 2004/0022888 A1 | | 2/2004 | Sreenivasan et al. |
| 2004/0036201 A1 | | 2/2004 | Chou et al. |
| 2004/0038552 A1 | | 2/2004 | Watts et al. |
| 2004/0046288 A1 | | 3/2004 | Chou |
| 2004/0065252 A1 | | 4/2004 | Sreenivasan et al. |
| 2004/0110856 A1 | | 6/2004 | Young et al. |
| 2004/0118809 A1 | | 6/2004 | Chou et al. |
| 2004/0124566 A1 | | 7/2004 | Sreenivasan et al. |
| 2004/0131718 A1 | | 7/2004 | Chou et al. |
| 2004/0137734 A1 | | 7/2004 | Chou et al. |
| 2004/0156108 A1 | | 8/2004 | Chou et al. |
| 2004/0192041 A1 | | 9/2004 | Jeong et al. |
| 2004/0197843 A1 | | 10/2004 | Chou et al. |
| 2005/0056963 A1 | * | 3/2005 | McCutcheon ............... 264/236 |
| 2007/0048449 A1 | * | 3/2007 | Shinya et al. ............... 427/355 |

FOREIGN PATENT DOCUMENTS

| | | | | |
|---|---|---|---|---|
| JP | | 02-24848 | | 1/1990 |
| JP | | 02-92603 | | 4/1990 |
| JP | | 3-32888 | * | 2/1991 ................ 427/494 |
| JP | | 4-70379 | | 5/1992 |
| WO | WO 99/05724 | | | 2/1999 |
| WO | WO 00/21689 | | | 4/2000 |
| WO | WO 01/47003 | | | 6/2001 |
| WO | WO 02/07199 | | | 1/2002 |
| WO | WO 03/010289 | | | 2/2003 |
| WO | WO 03/079416 | | | 9/2003 |
| WO | WO 03/099536 | | | 12/2003 |
| WO | WO 2004/114016 | | | 12/2004 |

OTHER PUBLICATIONS

Hackh's Chemical Dictionary, third edition, Julius Grant editor, McGraw-Hill Book Co., Inc., New York, 1944 (no month), excerpt p. 17.*

U.S. Appl. No. 10/897,734, filed Jul. 23, 2004, Watts et al.

U.S. Appl. No. 10/917,563, filed Aug. 13, 2004, Sreenivasan.

Chou, Nanoimprint Lithography and Lithographically Induced Self-Assembly, *MRS Bulletin*, pp. 512-517, Jul. 1, 2001.

Choi et al., Design of Orientation Stages for Step and Flash Imprint Lithography, Precision Engineering, pp. 192-199, Jan. 1, 2001.

Colbum et al., Step and Flash Imprint Lithography for sub-100 nm patterning, *Proceedings of SPIE*, vol. 3997, pp. 453-457, Jan. 1, 2000, copy ~½ illegable.

Chou et al., Imprint Lithography with 25-Nanometer Resolution, Science vol. 272, pp. 85-87, Apr. 5, 1996.

Chou et al., Imprint Lithography with Sub-10 nm Feature Size and High Throughput, *Microelectronic Engineering*, 35, pp. 237-240, Jan. 1, 1997.

Haisma et al., Mold-assisted Nanolithography: A Process for Reliable Pattern Replication, *J. Vac. Sci. Technol.* B, pp. 4124-4128, Nov. 1, 1996.

Chou et al., Imprint of Sub-25 nm Vias and Trenches in Polymers, *Appl. Phys. Lett.* 67 (21), Nov. 20, 1995.

Johnson et al., Advances in Step and Flash Imprint Lithography, *SPIE Microlithography Conference*, Feb. 23, 2003.

Chou et al., Lithographically Induced Self-assembly of Periodic Polymer Micropillar Arrays, *J. Vac. Sci. Technol.* B,17 (6), pp. 3197-3202, Nov. 1, 1999.

Colbum et al., Step and Flash Imprint Lithography: A New Approach to High-Resolution Patterning, Proc. Of SPIE, vol. 3676, Mar. 1, 1999.

Abstract of Japanese Patent 58-129074, (Pub. Aug. 1, 1983) Takeda.

Heidari, Nanoimprint Lithography at the 6 in. Wafer Scale, *J. Vac. Sci. Technol.* B,18(6), pp. 3557-3560, Nov. 1, 2000.

Translation of Japanese Patent 02-92603, Kurikawa et al Apr. 3, 1990.

Translation of Japanese Patent 02-24848, Kamio , Jan. 26, 1990.

Chou et al., Ultrafast and Direct Imprint of Nanostructures in Silicon, *Nature*, vol. 417, (Jun. 20, 2002), pp. 835-837, Jun. 20, 2002.

Chou et al., Nanoimprint Lithography, *Journal of Vacuum Science Technology B*,14(16), pp. 4129-4133, Nov. 1, 1996.

Colburn et al., Development and Advantages of Step-and-Flash Lithography, *Solid State Technology*, Jul. 1, 2001.

Colburn et al., Characterization and Modeling of Volumetric and Mechanical Properties for Step and Flash Imprint Lithography Photopolymers, Journal of Vacuum Science Technology. vol. b. 19(6), Nov. 1, 2001.

Bailey et al., Step and Flash Imprint Lithography: Defect Analysis, *Journal of Vacuum Science*, B, 19(6), pp. 2806-2810, Nov. 1, 2001.

Bailey et al., Step and Flash Imprint Lithography: Template Surface Treatment and Defect Analysis, *Journal of Vacuum Science*, B, 18(6), pp. 3572-3577, Nov. 1, 2000.

Schneider et al., Stripes of Partially Fluorinated Alkyl Chains: Dipolar Langmuir Monolayers, no date.

* cited by examiner

METHOD OF COMPENSATING FOR A VOLUMETRIC SHRINKAGE OF A MATERIAL DISPOSED UPON A SUBSTRATE TO FORM A SUBSTANTIALLY PLANAR STRUCTURE THEREFROM

STATEMENT REGARDING FEDERALLY SPONSORED RESEARCH OR DEVELOPMENT

The United States government has a paid-up license in this invention and the right in limited circumstance to require the patent owner to license other on reasonable terms as provided by the terms of 70NANB4H3012 awarded by National Institute of Standards (NIST) ATP Award.

BACKGROUND OF THE INVENTION

The field of invention relates generally to semiconductor device processing. More particularly, the present invention is directed to a method of compensating for a volumetric shrinkage of a material disposed upon a substrate to form a substantially planar structure therefrom.

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing increased reduction of the minimum feature dimension of the structures formed. Other areas of development in which micro-fabrication has been employed include biotechnology, optical technology, mechanical systems and the like.

As the minimum features size of structures formed on substrates is reduced, the need to form a substrate having a substantially planar surface is increased. A method of planarizing a substrate is disclosed in U.S. Patent Application Publication 2003/0184917 to Chang et al. Chang et al. describes a method of reducing step heights in the planarization of thin film carriers in an encapsulation system by utilizing an adhesive tape having a thinner adhesive thickness and a stiffer tape for the film sealing the encapsulant on the carrier to result in a low step height surface transition between the carrier and the cured encapsulant. Also, the composition of the encapsulant may be altered to reduce the shrinkage thereof during curing. A first approach to alter the composition of the encapsulant is to include absorbents in the formulation of the encapsulant to absorb the irradiation and reduce the curing effect. A second approach to alter the compostion of the encapsulant is to add a gas-emitting additive into the encapsulant, which will be converted into gaseous products upon irradiation.

Another method of planarizing a substrate is disclosed in U.S. Pat. No. 6,218,316 to Marsh. Marsh describes a method of planarizing a substrate having a planarization material disposed thereon and bringing a substantially flat surface into contact therewith. The planarization material is exposed to radiation at a first wavelength of light to cure the planarization material and is exposed to radiation at a second wavelength of light to cause changes to the planarization material that facilitate separation of the substantially flat surface from the planarization material.

It is desired, therefore, to provide an improved method of planarizing a substrate.

SUMMARY OF THE INVENTION

The present invention provides a method of planarizing a substrate with a template spaced-apart from the substrate having a liquid disposed therebetween, the method including; contacting the liquid with the template forming a first shape therein; and impinging radiation upon the liquid causing a reduction in volume of the liquid, with the first shape compensating for the reduction in volume such that upon impinging the actinic radiation upon the liquid, the liquid forms a contoured layer having a substantially planar shape. These embodiments and others are described more fully below.

DETAILED DESCRIPTION OF THE INVENTION

Figure 1:
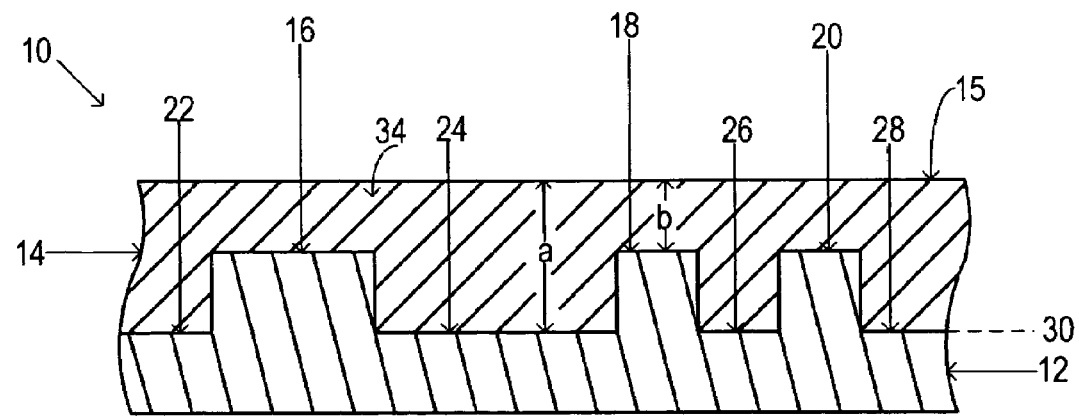
FIG. 1 is a simplified elevation view of a multi-layered structure, having a substrate and a transfer layer, prior to polymerizing and cross-linking a material of the transfer layer.

Referring to FIG. 1, a multi-layered structure 10 is shown prior to exposure to radiation, described further below. Multi-layered structure 10 comprises a substrate 12 and a transfer layer 14, with transfer layer 14 being disposed upon substrate 12. Substrate 12 may be formed from materials including, but not limited to, silicon, gallium arsenide, quartz, fused-silica, sapphire, organic polymers, siloxane polymers, borosilicate glass, fluorocarbon polymers or a combination thereof. Transfer layer 14 may be deposited upon substrate 12 in a plurality of methods including, but not limited to, chemical vapor deposition (CVD), physical vapor deposition (PVD), sputter deposition, spin-coating, and dispensing of a liquid. Transfer layer 14 comprises a surface 15 and as shown in FIG. 1, surface 15 comprises a substantially planar profile. However, surface 15 may comprise a substantially non-planar profile.

Substrate 12 may comprise a plurality of protrusions and recesses; however, only protrusions 16, 18, and 20 and recesses 22, 24, 26, and 28 are shown, with protrusions 16, 18, and 20 and recesses 22, 24, 26, and 28 forming a pattern on a surface 30 of substrate 12. The pattern formed on surface 30 of substrate 12 may be formed by such techniques including, but not limited to, photolithography, e-beam lithography, x-ray lithography, ion beam lithography, and imprint lithography. Imprint lithography is described in detail in numerous publications, such as United States published patent application 2004/0065976 filed as U.S. patent applicaiton Ser. No. 10/264,960, entitled, "Method and a Mold to Arrange Features on a Substrate to Replicate Features having Minimal Dimensional Variability"; United States published patent application 2005/0065252 filed as U.S. patent application Ser. No. 10/264,926, "Method of Forming a Layer on a Substrate to Facilitate Fabrication of Metrology Standards"; and United States published patent application 2004/0046271 filed as U.S. patent application Ser. No. 10/235,314, issued as U.S. Pat. No. 6,936,194, entitled "Functional Patterning Material for Imprint Lithography Processes" all of which are assigned to the assignee of the present invention. An exemplary lithographic system utilized in imprint lithography is available under the trade name IMPRIO 100™ from Molecular Imprints, Inc., having a place of business at 1807-C Braker Lane, Suite 100, Austin, Tex. 78758. The system description for the IMPRIO 100™ is available at www.molecularimprints.com and is incorporated herein by reference.

Additionally, it has been found beneficial to deposit a primer layer (not shown) when forming transfer layer 14 upon substrate 12. which may or may not include any previously disposed patterned/unpatterned layer present on substrate12. The primer layer (not shown) may function, inter alia, to provide a standard interface with transfer layer 14, thereby reducing the need to customize each process to the material upon which transfer layer 14 is to be deposited. In addition, the primer layer (not shown) may be formed from an organic material with the same etch characteristics as transfer layer 14. The primer layer (not shown) is fabricated in such a manner so as to posses a continuous, smooth, if not planar, relatively defect-free surface that may exhibit excellent adhesion to transfer layer 14. An exemplary material from which to form the primer layer (not shown) is available from Brewer Science, Inc. of Rolla, Mo. under the trade name DUV30J-6. The primer layer (not shown) may be deposited using any known technique with respect to patterned layer 14.

As mentioned above, substrate 12 comprises protrusions 16, 18, and 20 and recesses 22, 24, 26, and 28. Protrusion 16 may be disposed between recess 22 and recess 24; protrusion 18 may be disposed between recess 24 and recess 26; and protrusion 20 may be disposed between recess 26 and recess 28. Transfer layer 14 has a thickness 'a' defined between surface 15 and recess 24 and a thickness 'b' defined between surface 15 and protrusion 18, with thickness 'a' being greater than thickness 'b.' In the present example, thickness 'a' may have a value of approximately 250 nm and thickness 'b' may have a value of approximately 50 nm. However, thicknesses 'a' and 'b' may have any value desired.

Figure 2:
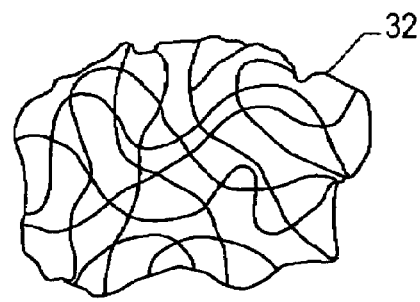
FIG. 2 is a simplified representation of the material from which the transfer layer, shown in FIG. 1, is comprised before being polymerized and cross-linked.
Figure 3:
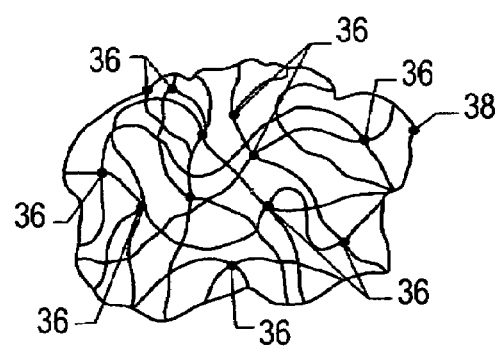
FIG. 3 is a simplified representation of cross-linked polymer material into which the material shown in FIG. 2 is transformed after being subjected to radiation.

Referring to FIGS. 1 and 2, transfer layer 14 may be formed from a material 32 forming a volume 34 within transfer layer 14. An exemplary composition for material 32 is disclosed in U.S. patent application Ser. No. 10/463,396, filed on Jun. 16, 2003, entitled "Method to Reduce Adhesions between a Conformable Region and a Pattern of a Mold," which is incorporated by reference in its entirety herein. Material 32 is shown in FIG. 3 as being cross-linked at points 36, forming a cross-linked polymer material 38.

Figure 4:
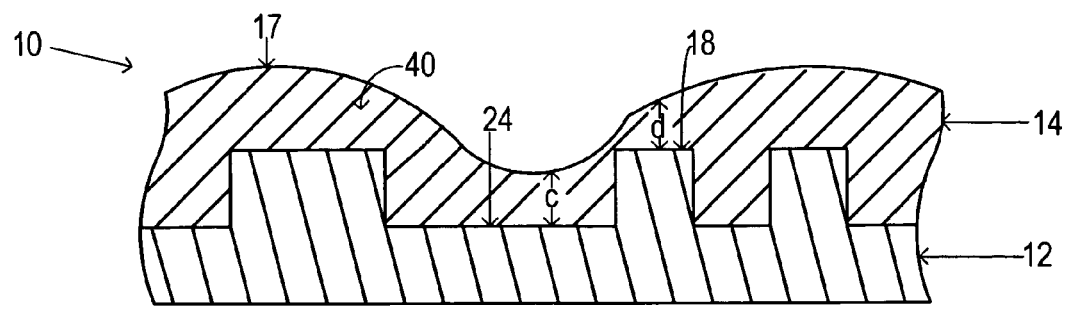
FIG. 4 is a simplified elevation view of the multi-layered structure, shown in FIG. 1, after the transfer layer is polymerized and cross-linked; imaging layer.

Referring to FIG. 4, multi-layered structure 10 is shown after radiation is impinged thereupon. Referring to FIGS. 1, 2, and 4, as a result, material 32 of transfer layer 14 is polymerized and cross-linked forming cross-linked polymer material 38, shown in FIG. 3, and as a result, the composition of transfer layer 14 transforms from material 32 to cross-linked polymer material 38, shown in FIG. 3, which is a solid.

However, upon polymerization, e.g. curing, of material 32 to form cross-linked polymer material 38 within transfer layer 14, volume 34 associated with transfer layer 14 is reduced by a shrinkage factor $F_1$, forming a volume 40, as shown in FIG. 4, within transfer layer 14, wherein shrinkage factor $F_1$ is a property of material 32. As a result, surface 15, shown in FIG. 1, transforms to form a surface 17, wherein surface 17 comprises a substantially non-planar profile, which is undesirable. As a result of forming volume 40 within transfer layer 14, the thickness of transfer layer 14 with respect to substrate 12 is reduced. More specifically, thickness 'a' is reduced to form a thickness 'c' between surface 17 and recess 24; and thickness 'b' is reduced to form a thickness 'd' between surface 17 and protrusion 18. Therefore, to minimize, if not prevent, forming surface 17 of multi-layered structure 10, a multi-layered structure 42, shown in FIG. 5, is utilized, described further below.

Figure 5:
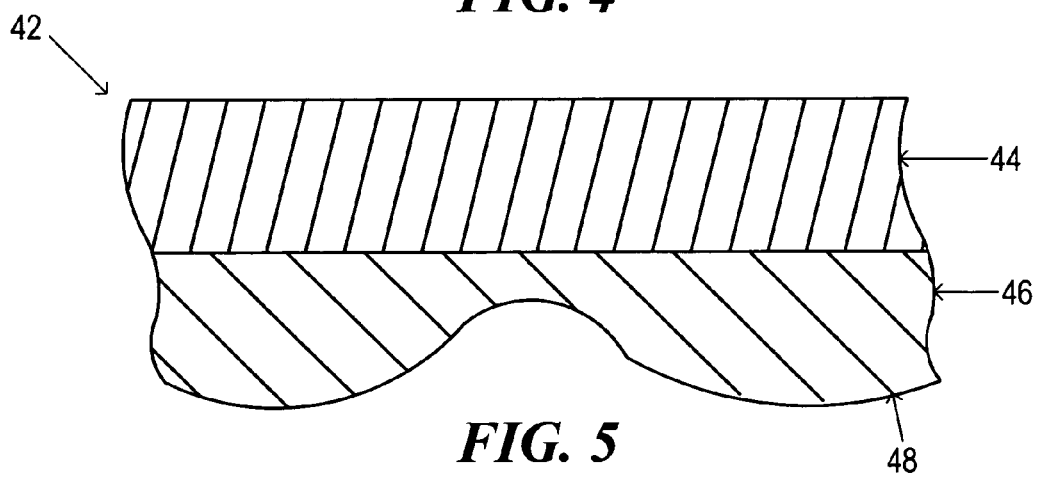
FIG. 5 is a simplified elevation view of a multi-layered structure comprising a template and an imaging layer.

Referring to FIG. 5, multi-layered structure 42 is shown. Multi-layered structure 42 comprises a substrate 44 and an imaging layer 46. Substrate 44 may be formed from any of the materials mentioned above with respect to substrate 12, shown in FIG. 1. Imaging layer 46 may be deposited upon substrate 44 in any of the methods mentioned above with respect to transfer layer 14, shown in FIG. 1.

Referring to FIGS. 1, 4, and 5, as mentioned above, volume 34 associated with transfer layer 14 is reduced by a shrinkage factor $F_1$, forming a volume 40, as shown in FIG. 4, within transfer layer 14, and thus surface 15 transforms to form a surface 17, wherein surface 17 comprises a substantially non-planar profile, which is undesirable. To that end, a priori knowledge of the shrinkage factor $F_1$ may be beneficial in that multi-layered structure 42 may be formed to compensate for such a shrinkage factor $F_1$ of material 32, shown in FIG. 2, of transfer layer 14 such that surface 17 may comprise a substantially planar profile after polymerization of material 32, shown in FIG. 2, within transfer layer 14. More specifically, a surface 48 of multi-layered structure 42 is formed to have a profile that is substantially the same as the profile of surface 17 of multi-layered structure 10. To form substantially the same profile as surface 17 of multi-layered structure 10 on multi-layered structure 42, imaging layer 46 may comprise a material such that when the same is subjected to radiation, a volume of the material is reduced by a shrinkage factor $F_2$, with shrinkage factor $F_2$ being substantially the same as shrinkage factor $F_1$ of material 32 of transfer layer 14, described further below.

In a first embodiment, to have shrinkage factor $F_2$ be substantially the same as shrinkage factor $F_1$, the material of imaging layer 46 may be selected such that the same comprises a component that reduces in volume in response to radiation being impinged thereupon. Therefore, an organic modified silicate may be utilized that comprises a functional group, wherein the percentage of reduction of volume of the material of imaging layer 46 depends upon the density of the functional group contained with the organic modified silicate. Exemplary materials from which to form imaging layer 46 are available from Microresist Technology GmbH located in Berlin, Germany under the trade names Ormocer® B59 and Ormocer® B66.

In a further embodiment, to have shrinkage factor $F_2$ be substantially the same as shrinkage factor $F_1$, the material of imaging layer 46 may be selected such that the same may comprise a first component that expands in volume in response to radiation impinged thereupon and a second component that reduces in volume in response to radiation impinged thereupon. By adjusting the ratio of the first and second components contained with the material of imaging layer 46, the shrinkage factor $F_2$ of the material of imaging layer 46 may be matched to the shrinkage factor $F_1$ of material 32, shown in FIG. 2 of transfer layer 14. A first composition for the material of imaging layer 46 consists of the following:

COMPOSITION 1 bisphenol A-glycidyl methacrylate
1,5,7,11-tetraoxaspiro[5.5]undecane
2-hydroxy-2-methyl-1-phenyl-propan-1-one
triarylsulfonium hexafluoroantimonate salt The component bisophenol A-glycidyl methacrylate (Bis-GMA) has the following general structure:

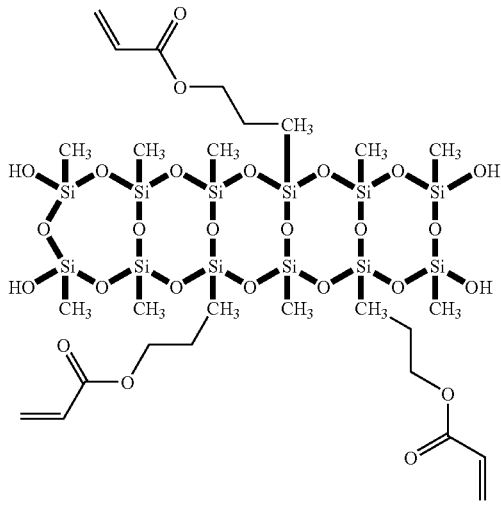

and comprises approximately 58% of COMPOSITION 1 by weight.

The component 1,5,7,11-tetraoxaspiro[5.5] undecane (TOSU) has the following general structure:

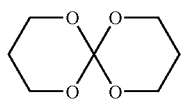

and comprises approximately 38.6% of COMPOSITION 1 by weight.

The component 2-hydroxy-2-methyl-1-phenyl-propan-1-one comprises approximately 1.9% of COMPOSITION 1 by weight and is available from Ciba Geigy located in Basel, Switzerland under the trade name Darocur® 1173. The component triarylsulfonium hexaflouroantimonate salt comprises approximately 1.5% of COMPOSITION 1 by weight and is available from Dow Chemical located in Midland, Mich. under the trade name UVI® 6976. In COMPOSITION 1, the component Bis-GMA reduces in volume in response to radiation impinged thereupon while the component TOSU expands in volume in response to radiation impinged thereupon. By adjusting the ratio of Bis-GMA and TOSU contained in COMPOSITION 1, the shrinkage factor $F_2$ of the material of imaging layer 46 may be matched to the shrinkage factor $F_1$ of transfer layer 14.

A second composition for the material of imaging layer 46 consists of the following:

COMPOSITION 2 diglycidyl ether of bisphenol-A
1,5,7,11-tetraoxaspiro[5.5]undecane triarylsulfonium hexafluoroantimonate salt The component diglycidyl ether of bisphenol-A comprises approximately 67.3% of COMPOSITION 2 by weight and is available from Dow Chemical located in Midland, Mich. under the trade name DER® 332. The component 1,5,7,11-tetraoxaspiro[5.5]undecane (TOSU) comprises approximately 28.9% of COMPOSITION 2 by weight. The component triarylsulfonium hexafluoroantimonate salt comprises approximately 3.8% of COMPOSITION 2 by weight. In COMPOSITION 2, the component diglycidyl ether of bisphenol-A reduces in volume in response to radiation impinged thereupon while the component TOSU expands in volume in response to radiation impinged thereupon. By adjusting the ratio of diglycidyl ether of bisphenol-A and TOSU contained in COMPOSITION 2, the shrinkage factor $F_2$ of the material of imaging layer 46 may be matched to the shrinkage factor $F_1$ of transfer layer 14. In a preferred embodiment, the material of imaging layer 46 comprises COMPOSITION 1.

Figure 6:
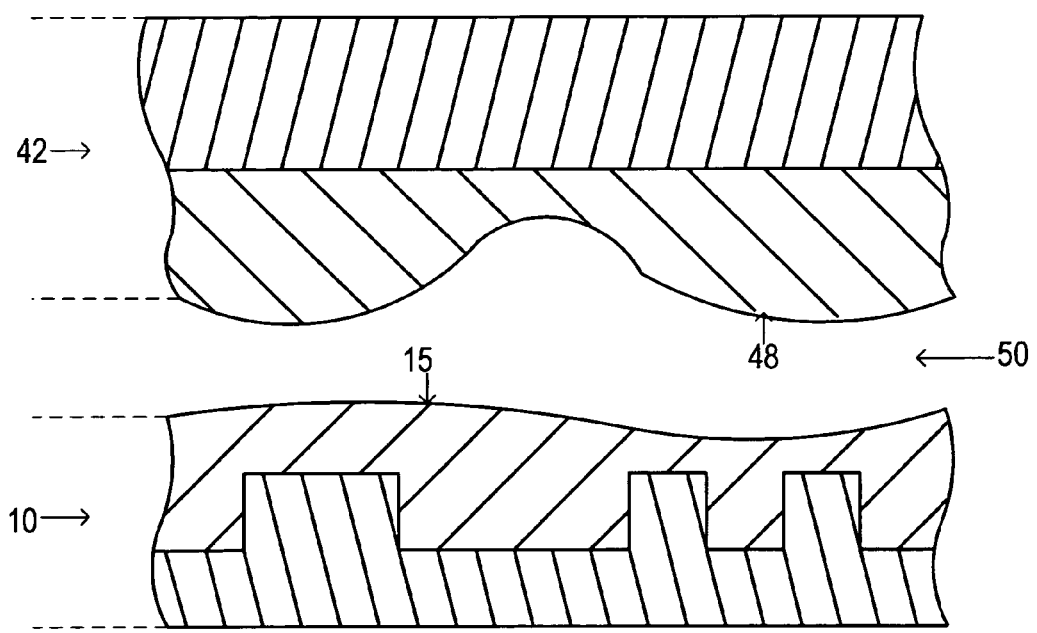
FIG. 6 is a simplified elevation view of the multi-layered structure of FIG. 5 prior to contact with the transfer layer of the multi-layered structure shown in FIG. 1.
Figure 7:
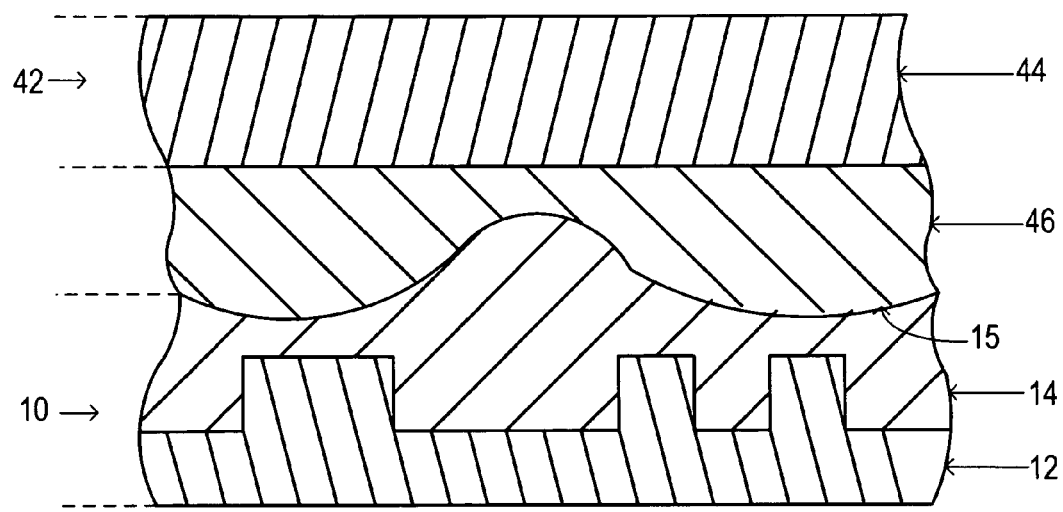
FIG. 7 is a simplified elevation view of the multi-layered structure of FIG. 5 in contact with the transfer layer of the multi-layered structure of FIG. 1.
Figure 8:
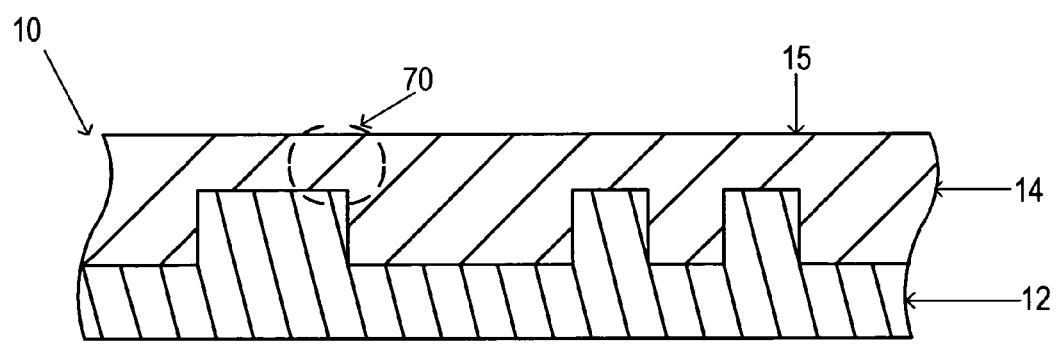
FIG. 8 is a simplified elevation view of the multi-layered structure of FIG. 5 after being exposed to radiation.

Referring to FIGS. 2 and 6, multi-layered structure 42 is shown spaced-apart from multi-layered structure 10 defining a gap 50 therebetween. To that end, to make mechanical contact between multi-layered structures 10 and 42, gap 50 is reduced, as shown in FIG. 7. Surface 15 of multi-layered structure 10 conforms to a profile of surface 48 of multi-layered structure 42. After gap 50 is reduced, radiation is impinged upon material 32 of transfer layer 14 to polymerize and cross-link the same, forming cross-linked polymer material 38, shown in FIG. 3, which is solid. The radiation impinged upon multi-layered structure 10 may be ultraviolet, thermal, electromagnetic, visible light, heat, and the like. The selection of radiation impinged upon to initiate the polymerization of transfer layer 14 is known to one skilled in the art and typically depends on the specific application which is desired. Specifically, cross-linked polymer material 38, shown if FIG. 3, is solidified to provide surface 15 of multi-layered structure 10 with a substantially planar profile. After transfer layer 14 is transformed to consist of cross linked polymer material 38, gap 50 is increased such that multi-layered structures 10 and 42 are spaced-apart, as shown in FIG. 8, wherein surface 15 of multi-layered structure 10 is substantially planar.

Surface 15 comprises a substantially planar profile as a result of surface 48 of multi-layered structure 42. More specifically, imaging layer 46 makes a pattern in transfer layer 14 such that when material 32 of transfer layer 14 is exposed to actinic radiation, the reduction in volume of material 32 is such that surface 15 of multi-layered structure 10 comprises a substantially planar profile. To that end, surface 48 of multi-layered structure 42 is defined to facilitate in the formation of a planar profile in surface 15 of multi-layered structure 10, as desired.

Referring to FIG. 6, to properly form surface 15 of multi-layered structure 10 with a substantially planar profile, proper alignment of multi-layered structure 42 with respect to multi-layered structure 10 is needed. Ascertaining a proper alignment between multi-layered structure 42 and multi-layered structure 10 facilitates in compensating for the volumetric reduction in volume 34, shown in FIG. 1, of transfer layer 14 such that surface 15 comprises a substantially planar profile.

Figure 9:
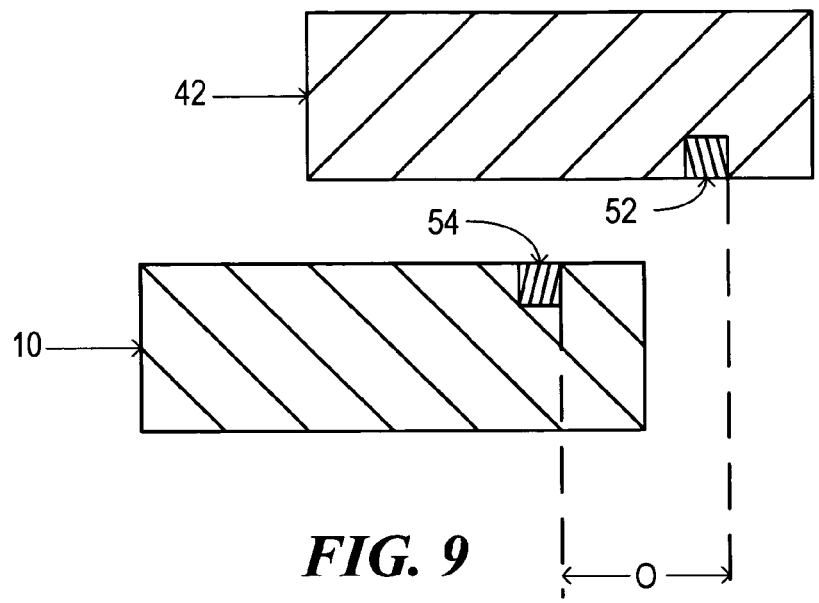
FIG. 9 is a simplified elevation view of the multi-layered structure of FIG. 5 in superimposition with the multi-layered structure of FIG. 1 showing misalignment along one direction.
Figure 10:
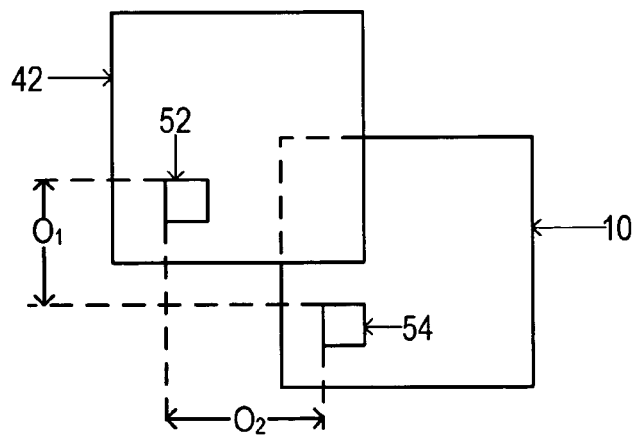
FIG. 10 is a top-down view of the multi-layered structure of FIG. 5 and the multi-layered structure of FIG. 1 showing misalignment along two transverse directions.
Figure 11:
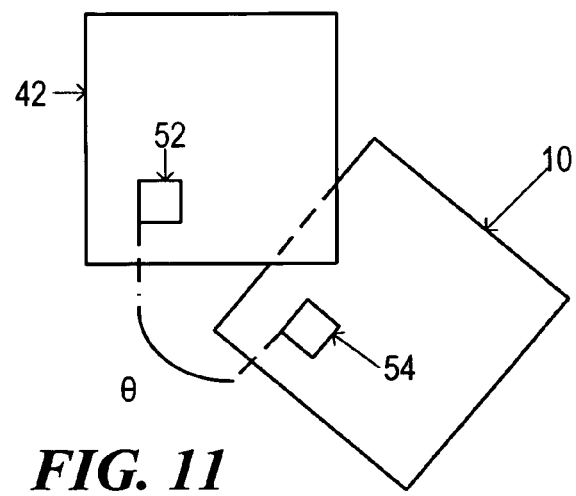
FIG. 11 is a top-down view of the multi-layered structure of FIG. 5 and the multi-layered structure of FIG. 1 showing angular misalignment.

Referring to FIGS. 9 and 10, to facilitate the above-mentioned alignment of multi-layered structures 10 and 42, multi-layered structure 42 may include multi-layered structure alignment marks, one of which is shown as 52, and multi-layered structure 10 may include multi-layered structure alignment marks, one of which is shown as 54. In the present example, it is assumed that desired alignment between multi-layered structures 10 and 42 occurs upon multi-layered alignment mark 52 being in superimposition with multi-layered structure alignment mark 54. As shown in FIG. 9, desired alignment between multi-layered structures 10 and 42 has not occurred, shown by the two marks being offset a distance O. Further, although offset O is shown as being a linear offset in one direction, it should be understood that the offset may be linear along two directions shown as $O_1$ and $O_2$, as shown in FIG. 10. In addition to, or instead of, the aforementioned linear offset in one or two directions, the offset between multi-layered structures 10 and 42 may also consist of an angular offset, shown in FIG. 11 as angle θ. An exemplary embodiment for alignment marks 52 and 54 is disclosed in U.S. Pat. No. 5,414,514 entitled "On-Axis Interferometric Alignment of Plates using the Spatial Phase of Interference Patterns," and U.S. Pat. No. 5,808,742 entitled "Optical Alignment Apparatus having Multiple Parallel Alignment Marks."

Figure 12:
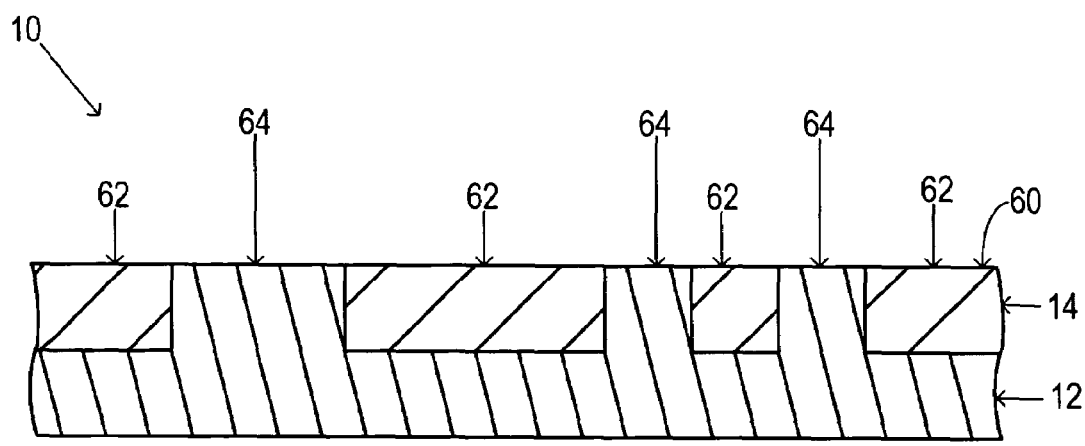
FIG. 12 is a simplified elevation view of the multi-layered structure of FIG. 5 having a crown surface formed thereon.

Referring to FIG. 12, in a further embodiment, multi-layered structure 10 may be subjected to a blanket etch such that a crown surface 60 is formed on multi-layered structure 10, wherein crown surface 60 is defined by an exposed surface 62 of each of protrusions 16, 18, and 20 and an upper surface of portions 64 that remain on transfer layer 14 after multi-layered structure 10 is subjected to the aforementioned blanket etch.

Figure 13:
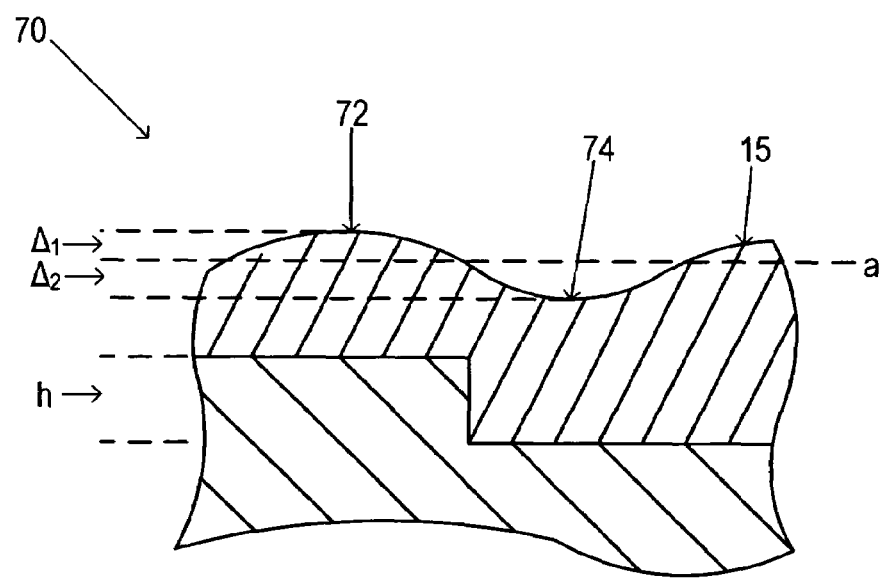
FIG. 13 is an exploded view of a region of the multi-layered structure of FIG. 8.

Referring to FIG. 13, a portion 70 of multi-layered structure 10, shown in FIG. 8, is depicted, wherein portion 70 displays a level of planarity of surface 15 that is preferred in the present invention. Surface 15 comprises a plurality of hills and valleys; however, only hill 72 and valley 74 are shown. The plurality of hills and valleys of surface 15 define an average plane of planarity, shown as plane 'a,' of surface 15. However, the plurality of hills and valleys of surface 15 may deviate from plane 'a' by differing magnitudes and wherein, for simplicity, each deviation may be defined as $\Delta_{dev}$. More specifically, a zenith of hill 72 may deviate from plane 'a' a magnitude $\Delta_1$ and a nadir of valley 74 may deviate from plane 'a' a magnitude $\Delta_2$. The values of the deviations of the plurality of hills and valleys of surface 15, $\Delta_{dev}$, from plane 'a' are a function of a step height 'h' of protrusions 16, 18 and 20. In the present invention, a preferred level of planarity of surface 15 is defined by the equation:

$$\Delta_{dev} \leq h/N, \quad (1)$$

wherein it is desirable to have $N \geq 1$. To that end, a more preferred level of planarity of surface 15 is defined by the equation:

$$\Delta_{dev} \leq h/5 \quad (2)$$

and a most preferred level of planarity of surface 15 is defined by the equation:

$$\Delta_{dev} \leq h/10. \quad (3)$$

Figure 14:
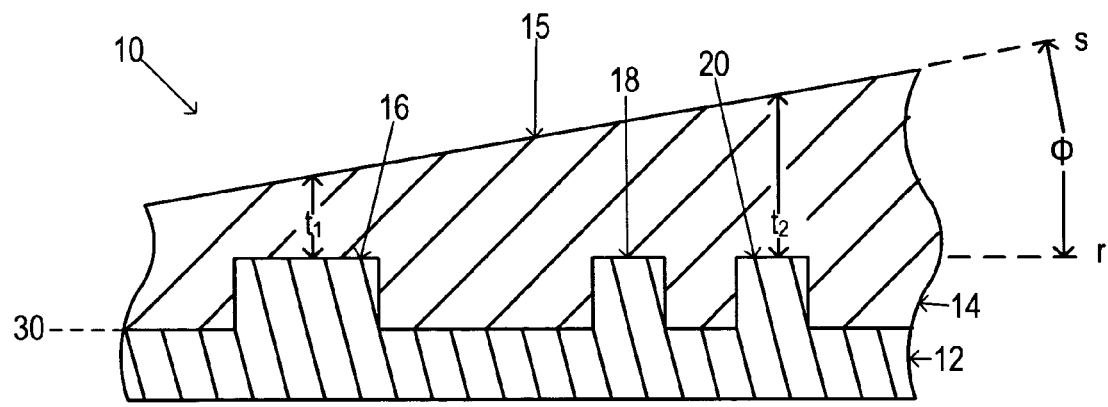
FIG. 14 is a simplified elevation view of the multi-layered structure of FIG. 8 having a tilted surface.

Referring to FIG. 14, surface 15 of multi-layered structure 10 is shown tilted with respect to surface 30. More specifically, an angle Φ is formed between surface 15 and surface 30. The angle Φ is formed as a result in the difference in thickness of transfer layer 14 across multi-layered structure 10. More specifically, a thickness '$t_1$' is defined between protrusion 16 and surface 15 and a thickness '$t_2$' is defined between protrusion 20 and surface 15. The difference in magnitudes of thicknesses '$t_1$' and '$t_2$' define a thickness variation $\Delta t$.

In the present invention, it may be preferable to minimize the angle Φ such that $\Delta_t$ may have a magnitude defined by the equation:

$$\Delta_t \leq h, \quad (4)$$

wherein h, shown in FIG. 13, is the aforementioned step height of protrusions 16, 18, and 20. However, it may be more preferable to minimize the angle Φ such that $\Delta_t$ may be defined by the equation:

$$\Delta_t \leq h/5, \quad (5)$$

and it may be most preferable to minimize the Φ such that $\Delta_t$ may be defined by the equation:

$$\Delta_t \leq h/10, \quad (6)$$

To minimize the angle Φ, a compliant device may be employed, such as disclosed in U.S. patent application Ser. No. 10/858,100, filed Jun. 1, 2004 and entitled "A Compliant Device for Nano-scale Manufacturing," which is incorporated by reference in its entirety herein.

Figure 15:
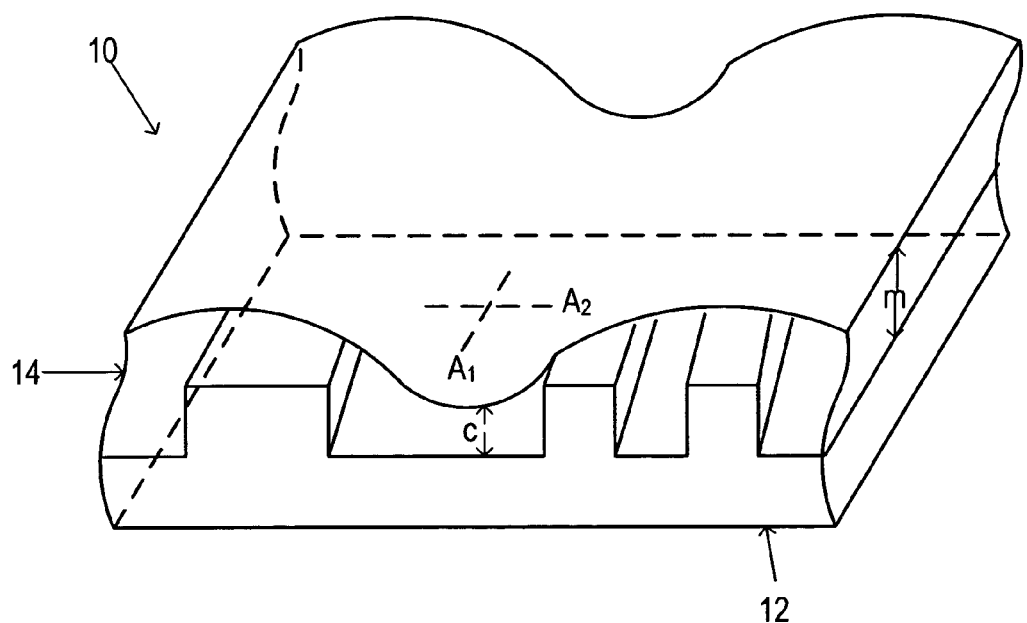
FIG. 15 is a top-down view of the multi-layered structure shown in FIG. 4.

Referring to FIGS. 4 and 15, although the reduction in thickness of transfer layer 14 is shown along a single axis, the reduction in thickness of transfer layer 14 may be along two axes $A_1$ and $A_2$, wherein axes $A_1$ and $A_2$ may be placed transverse to one another. As shown in FIG. 14, a reduction in thickness of transfer layer 14 may be along axis $A_1$ resulting in a thickness 'c' as mentioned above, and a reduction in thickness of transfer layer 14 along axis $A_2$ resulting in a thickness 'm.' Therefore, the above-mentioned process for compensating for a volumetric reduction of a material disposed upon a substrate to form a substantially planar structure may be along two axes.

While this invention has been described with references to various illustrative embodiments, the description is not intended to be construed in a limiting sense. As a result various modifications and combinations of the illustrative embodiments, as well as other embodiments of the invention, will be apparent to persons skilled in the art upon reference to the description. It is, therefore, intended that the appended claims encompass any such modifications or embodiments.

What is claimed is:

1. A method of planarizing a substantially nonplanar substrate with a template spaced-apart from said substrate having a liquid disposed therebetween, said method comprising:

contacting said liquid with said template forming a first shape in a first surface of said liquid, with said first shape being substantially non-planar; and impinging actinic radiation upon said liquid causing a reduction in volume of said liquid, with said first shape compensating for said reduction in volume such that upon impinging said actinic radiation upon said liquid, said liquid forms a layer having a substantially planar surface, with said planar surface being derived from said first surface.

2. The method as recited in claim 1 wherein contacting said liquid further includes contacting said liquid with a surface of said template, with said surface being substantially non-planar.

3. The method as recited in claim 1 wherein impinging said radiation further includes causing said reduction in volume of said liquid by a shrinkage factor, with said shrinkage factor being a function of said liquid.

4. The method as recited in claim 1 wherein said substrate comprises a plurality of protrusions having a height with a first thickness being defined between a first subset of said plurality of protrusions and said surface of said layer and a second thickness being defined between a second subset or said plurality of protrusions and said surface of said layer, with a difference between said first thickness and said second thickness being less than said height.

5. The method as recited in claim 1 wherein said sabstrate comprises a plurality of protrusions having a height and said surface of said layer comprises a pluarality of hills and valleys having a deviation from planarity associated therewith and wherein said deviation is less than said height.

6. The method as recited in claim 1 wherein impinging radiation further includes selecting said radiation from a group consisting essentially of ultraviolet, infrared, visble, and combinations therof.

7. A method of planarizing a substantially nonplanar substrate with a template spaced-apart from said substrate having an imprinting material disposed therebetween, said method comprising:

contacting said imprinting material with said template forming a first shape in a first surface of said imprinting material, with said first shape being substantially non-planar, said imprinting material being in a first phase state; and producing a phase state change within said imprinting material such that said imprinting material is in a second phase state differing from said first phase state, with said phase state change causing a reduction in volume of said imprinting material, with said first shape compensating for said reduction in volume such that upon producing said phase stage change, said imprinting material forms a layer having a substantially planar surface, with said planar surface being derived from said first surface.

8. The method as recited in claim 7 wherein producing said phase state change further includes impinging radiation upon said imprinting material, with said radiation being selected from a group consisting essentially of ultraviolet, infrared, visble, and combinations thereof.

9. The method as recited in claim 7 wherein said imprinting material comprises an activating light curable liquid, with producing said phase change state further including impinging said activating light so as to cure from said activating light curable liquid, solidified material.

10. The method as recited in claim 7 wherein said substrate comprises a plurality of protrusions having a height with a first thickness being defined between a first subset of said plurality of protrusions and said surface of said layer and a second thickness being defined between a second subset of said plurality of protrusions and said surface of said layer, with a difference between said first thickness and said second thickness being less than said height.

11. The method as recited in claim 7 wherein said substrate comprises a plurality of protrustons having a height and with said surface of said layer comprises a plurality of hills and valleys having deviation from planarity associated therewith and wherein said deviation is less than said height.

12. The method as recited in claim 7 wherein contacting said imprinting material further includes contacting said imprinting material with a surface of said template, with said surfuce being substantial non-planar.

13. A method of planarizing a substantially nonplanar substrate with a template spaced-apart from said substrate having a liquid disposed therebetween, said method comprising:

contacting said liquid with said template forming a first shape in a first surface of said liquid, with said first shape being substantially non-planar; and impinging actinic radiation upon said liquid causing a reduction in volume of said liquid by a shrinkage factor, with said first shape compensating for said reduction in volume such that upon impinging said actinic radiation, said liquid forming a layer having a substantially planar surface, with said planar surface being derived from said first surface, with said shrinkage factor being a function of said liquid.

14. The method as recited in claim 13 wherein contacting said liquid further includes contacting said liquid with a surface of said template, with said surface being substantially non-planar.

15. The method as recited in claim 14 wherein said substrate comprises a plurality of protrusions having a height with a first thickness being defined between a first subset of said plurality of protrusions and said surface of said contoured layer and a second thickness being defined between a second subset of said plurality of protrusions and said surface of said layer, with a difference between said first thickness and said second thickness being less than said height.

16. The method as recited in claim 15 wherein said substrate comprises a plurality of protrusions having height and said surface of said layer comprises a plurality of hills and valleys having a deviation from planarity associated therewith and wherein said deviation is less than said height.

17. The method as recited in claim 16 wherein impinging radiation further includes selecting said radiation from a aroup consisting essentially of ultraviolet, infrared, visible, and combinations thereof.

* * * * *